United States Patent [19]

Tsai et al.

[11] Patent Number: 5,037,515
[45] Date of Patent: Aug. 6, 1991

[54] METHOD FOR MAKING SMOOTH-SURFACED MAGNETIC RECORDING MEDIUM

[75] Inventors: Hsiao-Chu Tsai, Fremont; Atef H. Eltoukhy, Saratoga, both of Calif.

[73] Assignee: HMT Technology Corporation, Fremont, Calif.

[21] Appl. No.: 408,655

[22] Filed: Sep. 18, 1989

[51] Int. Cl.[5] .............................................. C23C 14/34
[52] U.S. Cl. .............................. 204/192.15; 204/192.2
[58] Field of Search ..................... 204/192.15, 192.16, 204/192.2

[56] References Cited

U.S. PATENT DOCUMENTS

| 4,245,008 | 1/1981 | Michaelsen et al. | 204/192.2 X |
| 4,426,265 | 1/1984 | Brunsch et al. | 204/192.2 |
| 4,552,820 | 11/1985 | Lin et al. | 204/192.15 X |
| 4,576,700 | 3/1986 | Kadokura et al. | 204/192.15 |
| 4,604,179 | 8/1986 | Eltoukhy et al. | 204/192.15 X |

FOREIGN PATENT DOCUMENTS

WO89/05362 6/1989 PCT Int'l Appl. ............. 204/192.2

Primary Examiner—Nam X. Nguyen
Attorney, Agent, or Firm—Peter J. Dehlinger

[57] ABSTRACT

A high-density thin-film magnetic disc and method of producing the disc. In forming the disc, chromium is sputtered onto a smooth-surfaced, non-metallic substrate, such as a glass substrate, first at room temperature, to form a substratum with a random structure, then at a high temperature, to form a chromium underlayer with anisotropic crystal orientation. A cobalt-based alloy is sputtered onto the underlayer to form the thin film magnetic layer. The disc has high coercivity, low bit shift, and can be operated at a flying height of between 2-4 μinches.

8 Claims, 2 Drawing Sheets

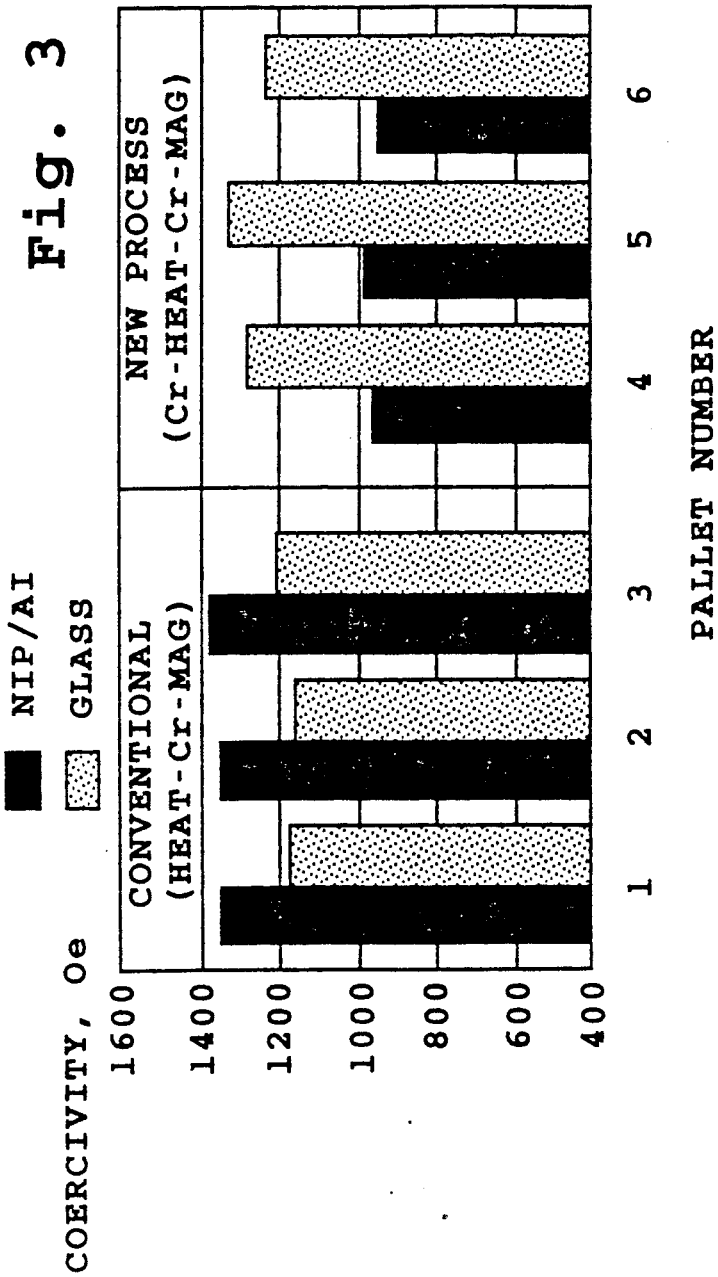

METHOD FOR MAKING SMOOTH-SURFACED MAGNETIC RECORDING MEDIUM

FIELD OF THE INVENTION

The present invention relates to magnetic recording media, and particularly to smooth-surfaced magnetic recording media which can be operated with flying heights as low as 2–4 μinches.

BACKGROUND OF THE INVENTION

Over the past several years, a significant increase in recording density in thin-film media has been achieved, and there is a continuing effort to increase recording density further.

A number of magnetic properties in a thin-film media are important to achieving high recording density. One of these is coercivity, defined as the magnetic field required to reduce the remanence magnetic flux to zero, i.e., the field required to erase a stored bit of information. Higher coercivity in a medium favors higher storage density by allowing adjacent recorded bits to be placed more closely together without mutual cancellation. Typically, coercivity values of greater than about 1,200 Oe (Oersted) are compatible with high recording density.

Another property of a thin-film medium which is relevant to recording density is bit shift or peak shift. This phenomenon is related to the broadening of signal peaks, as well as to the intersymbol interference. To the extent that the bit shifting limits the resolution at which adjacent voltage peaks can be read, it places an upper limit on recording density. That is, the higher the bit shift values in a thin-film medium, the lower the recording density which can be achieved.

Flying height, i.e., the distance which a read/write head floats above the spinning disc, is another important factor in achieving high recording density. It can be appreciated that less overlap of voltage signals in adjacent magnetic domains in the disc occurs as the read/write head is moved closer to the disc surface, allowing recording density to be increased. The flying height is limited principally by surface irregularities on the disc.

Thin-film media having high coercivity and reasonably low bit shift values have been prepared using aluminum substrates. Typically, the aluminum substrate is first plated with a selected alloy plating, such as a nickel/phosphorus plating, to achieve a requisite surface hardness, then polished to remove surface nodules which form during the plating process. Because the nodules have varying degrees of hardness, the polishing step tends to leave surface irregularities in the form of surface depressions or mounds.

After surface preparation, the metal substrate is moved through a sputtering apparatus, where successive sputtering steps are used to deposit an underlayer and a cobalt-based thin-film magnetic layer. The underlayer is required for forming a crystalline surface which effectively orients the c-axis of the magnetic film crystals either in-plane for longitudinal recording, or out-of-plane for vertical recording. A carbon coating is applied over the magnetic layer for lubricating and wear-resistance properties.

This method for producing a metal-disc thin-film medium is illustrated in co-owned U.S. Pat. No. 4,816,127. Here a chromium underlayer is applied to a coated metal substrate by sputtering to a final underlayer thickness of 1,000–4,000 Å. It is necessary, in forming an underlayer with the desired crystal anisotropy, to perform the sputtering at an elevated temperature, typically above about 200°–300° C. After the underlayer is formed, the disc is transferred to a second sputtering station, where a cobalt-based magnetic layer is sputtered onto the underlayer. The resultant disc can have a coercivity, with respect to longitudinal recording, of greater than 1,200 Oe.

Despite the favorable magnetic properties which can be achieved in a metal-disc thin-film disc of the type just described, the recording density of the disc is limited in flying height by irregularities on the surface of the disc (due to surface irregularities in the metal substrate surface). The best flying head distances which have been achieved with metal-substrate discs is about 6 μinches.

It is possible to reduce flying height, and therefore to increase recording density, by forming a thin-film magnetic layer on a smooth-surfaced substrate, such as a glass or ceramic substrate. Thin-film media having glass or ceramic, or temperature-resistant polymer substrates have been proposed. However, difficulties in achieving performance characteristics needed for high recording density have limited this approach to date. Experiments conducted in support of the present invention, for example, indicate that thin-film media formed by prior art sputtering methods tend either to have relatively high bit shift values, e.g., greater than 18–20 ns, or relatively low coercivity values, e.g., less than 1,200 Oe. As discussed above, either low coercivity or high bit shift would limit the recording density which could be achieved in the disc.

SUMMARY OF THE INVENTION

It is one general object of the invention to provide a smooth-surfaced thin film magnetic medium having high coercivity and low bit shift performance characteristics.

It is a related object of the invention to provide a method for producing such a medium.

In one aspect, the invention includes a method of producing a smooth-surfaced magnetic recording disc. The method includes sputtering chromium onto the surface of the smooth-surfaced non-metallic substrate, while maintaining the sputtering temperature below about 100° C., and preferably about room temperature, to form a substratum having a final thickness of at least about 50 Å, and preferably less than about 400 Å. The substrate and substratum are then heated to a temperature between about 200°–500° C., and preferably about 300° C. or more, and additional chromium is sputtered onto the substratum, to form an underlayer having a final thickness, not including the thickness of the substratum, of at least about 400 Å, where the total underlayer thickness is preferably less than about 4,000 Å. A cobalt-based magnetic thin film is formed on the underlayer by sputtering.

The method is preferably carried out under conditions which produce (a) a final surface smoothness which allows a flying height of between about 2–4 μinches, (b) a coercivity of greater than 1,200 Oe, in longitudinal recording, and (c) a bit shift of less than about 16 ns.

In another aspect the invention includes a thin film magnetic disc characterized by: (a) a final surface smoothness which allows a flying height of between about 2–4 μinches, (b) a coercivity of greater than 1,200

Oe, in longitudinal recording, and (c) a bit shift of less than about 16 ns.

The disc is preferably prepared in accordance with the method just described and has (a) a chromium underlayer consisting of (i) a substratum, at least about 50 Å thick and having a relatively random crystal orientation, and (ii) an upper stratum at least about 400 Å thick, having a relatively anisotropic crystal orientation; and (b) a 300 to 1,500 Å thick Co-based alloy magnetic layer formed on the underlayer.

The invention also includes a method of forming a chromium underlayer on a smooth-surfaced, non-metallic substrate. The method includes sputtering chromium onto the surface of the substrate, with the substrate in a substantially unheated condition, to form a heat-absorbing chromium substratum on the substrate. The substrate and substratum are then heated to above about 200° C., and preferably between about 300°–500° C., and chromium is sputtered onto the substratum to form a chromium underlayer having a final thickness, not including the thickness of the substratum, of at least about 500 Å.

These and other objects and features of the invention will become more fully understood when the following detailed description of the invention is read in conjunction with the accompanying drawings.

BRIEF DESCRIPTION OF THE DRAWINGS

FIG. 3 is a bar graph showing coercivity values measured in discs having chromium underlayers prepared on glass (shaded bars) and coated aluminum (solid bars) substrates by sputtering chromium onto a preheated substrate (pallets 1-3) or by first sputtering an underlayer of substrate heating and additional chromium sputtering.

DETAILED DESCRIPTION OF THE DRAWINGS

Figure 1:
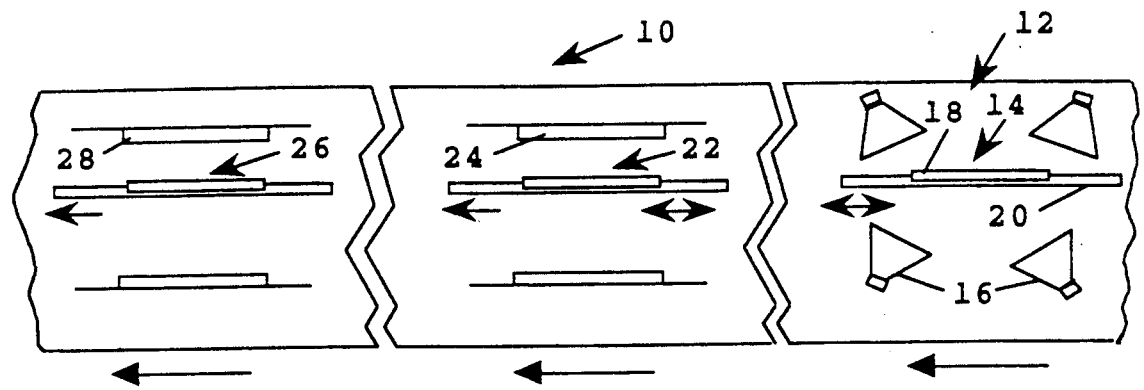
FIG. 1 is a schematic, fragmentary illustration of a sputtering apparatus suitable for carrying out the method of the invention.

FIG. 1 shows a schematic, fragmentary portion of a sputtering apparatus 10 which is suitable for use in practicing the method of the invention. The apparatus includes a vacuum chamber 12 having at least four stations at which sputtering or heating operations occur. A heating station 14 at the upstream end of the chamber has a plurality of infrared lights, such as lights 16, which are arrayed for heating both sides of a substrate, such as substrate 18, carried through the station in the chamber on a pallet 20.

Just downstream of the heating chamber is a first sputtering chamber 22 at which a chromium underlayer is formed on a substrate, in a manner to be described. The chamber includes a pair of targets, such as target 24, effective to sputter chromium onto opposite sides of a substrate.

A second sputtering station 26 downstream of chamber 22 is designed for sputtering a magnetic film onto the underlayer. The station includes a pair of sputtering targets, such as target 28, for sputtering a cobalt-based alloy used in forming the magnetic thin film.

Also included in the apparatus, but not shown here, is a final downstream station at which a carbon overcoat is sputtered on both sides of the magnetic disc. The basic sputtering apparatus is preferably a commercial system, such as in available from Circuits Processing Apparatus (Fremont, Calif.), ULVAK (Japan), Leybald Heraeus (Germany), VACTEC (Boulder, Colo.), or Materials Research Corporation (Albany, N.Y.). These systems are double-sided, in line, high-throughput machines having two interlocking systems, for loading and unloading.

Figure 2A:
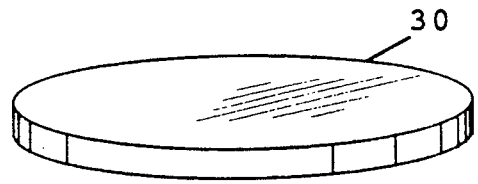
FIGS. 2A-2D illustrate features of the disc, under layer, and magnetic layer as these appear during the production of a magnetic disc in accordance with the invention.

FIG. 2A shows a substrate 30 for use in forming a thin-film medium in accordance with the invention. The substrate is a non-metallic, smooth-surfaced substrate, by which is meant a substrate formed of glass, ceramic material, or a heat-resistant polymer which can be prepared with a highly uniform or smooth surface. By smooth surfaced is meant that the substrate surface is sufficiently smooth such that, in the finished disc, the flying head height can be as little as 2–4 μinches.

Suitable types of glass include soda-lime and aluminosilicate glasses. One preferred substrate is an aluminosilicate glass substrate having a highly polished surface, a thickness of about 0.05 inch, and a diameter of 3 ½ inches. Smooth-surfaced substrates of this type are commercially available from Hoya (Japan). Ceramic materials which are suitable for substrates in the invention include Canasite TM manufactured by Corning glass.

In producing a thin-film medium in accordance with the invention, a chromium substratum having a thickness of at least about 50 Å is first sputtered onto the smooth-surfaced, non-metallic substrate at a relatively low temperature, preferably room temperature and at most about 100° C.

Following substratum formation, the sputtering of chromium onto the substrate is discontinued while the substrate and substratum are heated to conventional sputtering temperatures between about 200°–500° C., and preferably about 300° C. or more. A second sputtered chromium layer is then applied to the heated substrate and substratum, to form a chromium underlayer which consists of the substratum and the second upper chromium layer. The total thickness of the underlayer, not including the thickness of the substratum, is at least about 400 Å, and the total thickness of the underlayer, including the substratum, is less than about 4,000 Å.

Figure 2B:
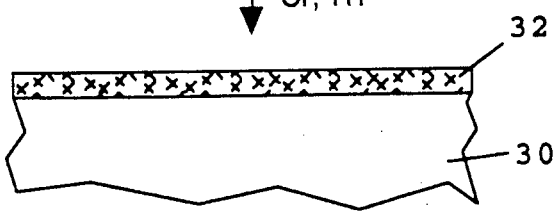

FIG. 2B shows an upper surface portion of a substrate and the substratum 32. The randomly oriented dashed lines in the substratum are intended to indicate a randomly oriented crystal structure, indicating that a dominant pattern of crystal growth along preferred axial directions has not yet been established. The lack of oriented crystal growth may be due both to the relatively low temperature at which with substratum is sputtered, and the amorphous surface structure of the substrate, including the presence of chemical toughened surface layer.

As indicated above, sputtering is discontinued and the substratum is heated after the initial sputtering step. This separate heating step permits oxidation of the substratum surface, and such oxidation may contribute to surface properties of the substratum which are favorable for achieving the desired magnetic properties in the disc.

Figure 2C:
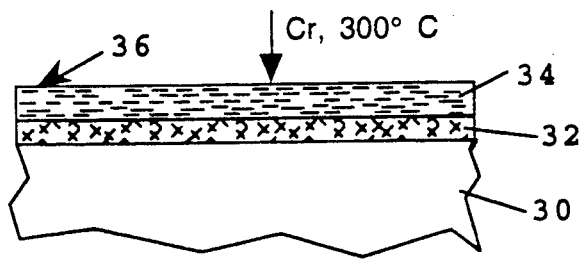
Figure 2D:
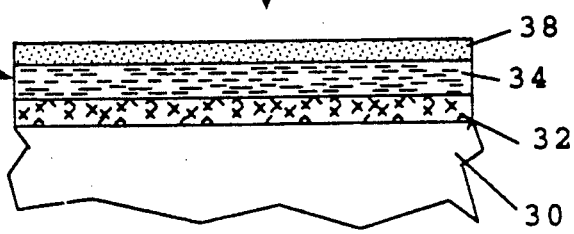

The second chromium sputtering step, which is carried out at high temperature, produces a chromium deposition layer 34 whose predominant (110) crystal plane lies in the plane of the substrate, as indicated in FIG. 2C. That is, the upper chromium layer has a high anisotropic parallel/perpendicular crystal orientation ratio, and is therefore substantially more anisotropic than the crystal orientation of the substratum. This anisotropy is important in establishing desired magnetic layer crystal orientation during formation of the magnetic layer in the parallel c-axis direction, which in turn, is requisite for achieving high coercivity in longitudinal reading. The underlayer, indicated at 36 in FIGS. 2C and 2D, is composed of substratum 32 and upper chromium layer 34.

Following formation of the two-stratum chromium underlayer, a magnetic layer 38 (FIG. 2D) is sputtered conventionally onto the chromium the substrate, to a desired thickness, and the medium may be coated, also by sputtering, with a protective carbon overcoat.

In practicing the method of the invention, the substrate is placed on a pallet, such as pallet 20, in a sputtering apparatus, and the apparatus chamber is evacuated, e.g., to a vacuum of about $10^{-7}$ Torr. The substrate is moved through the heating chamber with little or no heating, as indicated above, and into the first sputtering chamber, where the chromium substratum is formed. The final thickness of the substratum is controlled by the speed of substrate movement into and through the first sputtering chamber, and the rate of sputtering in the chamber. The target in the first sputtering station is typically set at a preferred target power of between about 0.5 and 2 kw, and the rate of substrate movement through the target area is about 30–50 cm/min. The final thickness of the substratum is at least about 50 Å and preferably less than 400 Å.

The pallet containing the substrate is then moved in an upstream direction to place the substrate and substratum in the heating station, where the substrate is heated to at least about 200° C., as indicated above. The desired temperature is typically reached after less than one minute of heating at a heating level of about 2.5 KW/substrate side. By contrast, heating an untreated substrate (without the chromium substratum) to a temperature of 200°–300° C. was found to be very difficult in the vacuum chamber. Thus one important function of the substratum is allow a non-metal substrate having a relatively low coefficient of heat absorption to be heated efficiently.

The heated pallet is now moved again in a downstream position to place the heated substrate in the first sputtering chamber, where the upper stratum of the underlayer is formed. The chromium target in the first sputtering station is typically set at a preferred target power of between about 2 to 5 KW, and the rate of substrate movement through the target area is about 30–60 cm/min, to achieve a final thickness in the underlayer of about 500 to 4,000 Å. It is noted here that the sputtering conditions are such as to maintain the substrate temperature close to that produced in the heating station. As indicated above, sputtering under these heat conditions leads to favorable anisotropic crystal formation in the underlayer.

After formation of the underlayer, the substrate is moved downstream on the pallet into the second sputtering chamber, where the magnetic layer is sputtered onto the underlayer. One exemplary cobalt-based alloy includes between 70–88% cobalt, 10–28% nickel, and 2–10% chromium, and more preferably, 74–78% cobalt, 15–25% nickel, and 5–10% chromium, as detailed in co-owned U.S. Pat. No. 4,816,127. Another exemplary cobalt-based alloy for use in forming the magnetic film includes 1–10% tantalum, 10–16% chromium, and 60–85% cobalt.

The magnetic thin film is sputtered onto the underlayer under known conditions, such as described in the just-mentioned patent, to a final thickness of between about 300–1,500 Å. The temperature of the substrate and underlayer is preferably close to that produced in the heating station during the magnetic-film sputtering step.

After formation of the magnetic thin film, the substrate is carried on the pallet toward a third sputtering station (not shown) at which a carbon overcoat is applied according to known sputtering methods.

Coercivity measurements have been made on a variety of thin-film discs constructed in accordance with the present invention, where the thickness of the substratum, as a percentage of the total underlayer thickness (about 500–600 Å) varies between 9% to 46%. The results of the measurements indicate:

1. a substratum thickness of at least about 50 Å and a total underlayer thickness of at least about 500 Å are needed for achieving optimal coercivity;
2. heating the glass substrate prior to sputtering the chromium substratum significantly reduces coercivity; and
3. the two-stage underlayer sputtering operation which enhances coercivity in a glass-substrate disc, actually decreases coercivity in a medal-substrate disc, as described below.

FIG. 3 shows coercivity values for thin film magnetic discs prepared on glass (shaded bar) and aluminum (solid bar) substrates. Discs 1–3 were prepared conventionally by sputtering a continuous chromium underlayer on a heated substrate to a final underlayer thickness of 500–600 Å. Onto this layer was sputtered a 600 Å magnetic layer composed of cobalt, chromium and tantalum, as described above.

Discs 4–6 were prepared in accordance with the present invention, by sputtering a 50 Å chromium substratum onto the substrate, heating the substrate and substratum to 300° C., and sputtering chromium onto the substratum to a final underlayer thickness of about 500–600 Å. The magnetic layer sputtered onto the underlayer is substantially identical to that applied to discs 1–3.

As seen in FIG. 3, thin-film media prepared according to the present invention, by sputtering a chromium underlayer in a two step procedure on a glass substrate, gave significantly higher coercivities (pallets 4–6) than in discs where the chromium underlayer was formed in a single continuous sputtering operation on a heated disc. In particular, coercivity values well above 1,200 Oe were obtained. Thin-film media formed on metal substrates showed an opposite effect: significantly higher coercivities were obtained by forming the underlayer in a continuous, operation.

Bit shift determined by measuring the time shift in read voltage signals, were measured for (i) thin-film media prepared, as above, by forming a chromium underlayer on a glass substrate at low temperature, followed by heating and additional chromium sputtering to complete the underlayer, (ii), thin-film media prepared by sputtering a continuous chromium underlayer on a heated glass substrate, and (iii), thin-film media prepared, as above, by sputtering a continuous chromium underlayer on a heated aluminum substrate.

Bit shift values for thin-film media prepared in accordance the invention were typically about 16 ns or less. By comparison, the glass-substrate media prepared by a standard, single underlayer sputtering method was characterized by bit shift values which average greater than 20 ns. These high bit shift values substantially limit the ability to achieve high recording density.

The bit shift values seen for the media of the present invention are, on average, about 1-2 ns lower than those for a thin-film disc prepared by conventional sputtering on a heated metal substrate. Thus the thin film media of the present invention combines high coercivity with low bit shift values.

More importantly, with respect to thin-film media formed metal substrates, the glass substrate disc of the invention allows a substantially smaller flying height than has been possible with conventional metal-substrate discs. Studies conducted in support of the present invention indicate that a flying height of between 2-4 $\mu$inches or less is readily achieved with the discs of the present invention. By contrast, the smallest flying height which has been achieved with a metal-substrate disc is about 6 $\mu$inches.

From the foregoing, it can be appreciated how various objects and features of the invention are met. The thin-film media of the invention provides a unique combination of high coercivity and low bit shift with the ability to operate at low flying heights in the 2-4$\mu$ inches range. These feature combine to produce a significantly higher recording density than has been possible with sputtered thin-film media known in the prior art.

The non-metallic substrate employed in the present invention also can provide a thinner disc using potentially less expensive substrates than Ni-plated aluminum substrates.

Although the invention has been described with respect to particular embodiments, it will be apparent to those skilled in the art that various changes and modifications can be made without departing from the invention.

It is claimed:

1. A method of producing a smooth-surfaced magnetic recording disc which can be operated at a flying head clearance of between about 2-4$\mu$ inches, comprising
   (a) sputtering chromium onto the surface of a smooth-surfaced, non-metallic substrate, at a temperature below about 100° C., to form a chromium substratum having a thickness of between about 50 Å and 400 Å, and a relatively randomly oriented crystal structure;
   (b) heating the substrate and substratum to a temperature of at least about 200° C., to form a heated substratum;
   (c) sputtering chromium onto the heated substratum to form thereon, an upper stratum whose crystal structure is substantially more anisotropic than that of the substratum, and which has a thickness of at least about 400 Å, said substratum and upper stratum forming a chromium underlayer having a total underlayer thickness of less than about 4,000 Å; and
   (d) sputtering a cobalt-based alloy onto the surface of said underlayer to form a magnetic thin-film layer having a thickness substantially between 300 and 1,500 Å.

2. The method of claim 1, wherein the substrate on which the substratum is sputtered is a glass substrate, and the sputtering steps are carried out under conditions which produce a coercivity, in longitudinal recording, of greater than about 1,200 Oe, and a bit shift of less than about 16 ns.

3. The method of claim 1, wherein sputtering the substratum is performed substantially at room temperature, and said heating is carried out under conditions which raise the temperature of the substrate to at least about 300° C.

4. The method of claim 1, wherein the chromium substratum has a final thickness of between about 50 and 200 Å and the chromium underlayer has a final thickness of between about 500 Å and 2,000 Å.

5. The method of claim 1, wherein said magnetic thin-film layer contains 1-10% tantalum, 10-16% chromium and 60-85% cobalt.

6. The method of claim 1, wherein said magnetic thin-film layer contains 2-10% chromium, 10-28% nickel, and 70-88% cobalt.

7. A method of forming a chromium underlayer on a smooth-surfaced, non-metallic substrate comprising:
   (a) sputtering chromium onto the surface of the substrate, with the substrate at a temperature below about 100° C., to form on the substrate, a heat absorbing substratum on the substrate having a thickness of between about 50 Å and 400 Å, and a relatively randomly oriented crystal structure;
   (b) heating the substrate and substratum to a temperature of at least about 200° C., to form a heated substratum; and
   (c) sputtering chromium onto the heated substratum to form thereon, a chromium deposition layer whose crystal structure is substantially more anisotropic than that of of the substratum, and which has a thickness of at least about 400 Å.

8. The method of claim 7, which further includes sputtering a cobalt-based magnetic thin layer over the substrate.

* * * * *